US009651427B2

(12) United States Patent
Chang et al.

(10) Patent No.: US 9,651,427 B2
(45) Date of Patent: May 16, 2017

(54) PYROELECTRIC SENSING DEVICE

(71) Applicants: Qisda (Suzhou) Co., Ltd., Suzhou (CN); Qisda Corporation, Taoyuan (TW)

(72) Inventors: Hsien Jung Chang, New Taipei (TW); Chi Cheng Lin, Taoyuan (TW)

(73) Assignees: Qisda (Suzhou) Co., LTD., Suzhou (CN); Qisda Corporation, Taoyuan (TW)

(*) Notice: Subject to any disclaimer, the term of this patent is extended or adjusted under 35 U.S.C. 154(b) by 0 days.

(21) Appl. No.: 14/689,066

(22) Filed: Apr. 17, 2015

(65) Prior Publication Data

US 2016/0018265 A1 Jan. 21, 2016

(30) Foreign Application Priority Data

Jul. 17, 2014 (TW) .............................. 103124578 A (51) Int. Cl.
| | |
|---|---|
| *G01J 5/00* | (2006.01) |
| *G01J 5/02* | (2006.01) |
| *G01J 5/34* | (2006.01) |
| *H02N 10/00* | (2006.01) |
| *H02K 7/075* | (2006.01) |
| *H02K 41/035* | (2006.01) |
| *H01L 41/09* | (2006.01) |
| *G01J 5/04* | (2006.01) |

(52) U.S. Cl.
CPC ............ *G01J 5/0205* (2013.01); *G01J 5/047* (2013.01); *G01J 5/34* (2013.01); *H01L 41/0926* (2013.01); *H02K 7/075* (2013.01); *H02K 41/0352* (2013.01); *H02N 10/00* (2013.01)

(58) Field of Classification Search
CPC ..................................................... G01J 5/0205
See application file for complete search history.

(56) References Cited

U.S. PATENT DOCUMENTS

| 3,665,353 | A | * | 5/1972 | Campbell | ................. H01F 7/13 335/258 |
| 6,161,382 | A | * | 12/2000 | Brotz | ........................ F03G 7/06 310/307 |
| 6,698,201 | B1 | * | 3/2004 | Sarkar | ....................... F03G 7/06 310/306 |
| 2014/0092414 | A1 | * | 4/2014 | Tezuka | ............... H04N 1/00395 358/1.13 |

FOREIGN PATENT DOCUMENTS

| CN | 102135630 A | 7/2011 |
| CN | 203415059 U | 1/2014 |
| CN | 103713489 A | 4/2014 |

* cited by examiner

*Primary Examiner* — Edwin Gunberg (57) ABSTRACT

A pyroelectric sensing device includes two pyroelectric sensors and a driving mechanism. The driving mechanism is used for driving the two pyroelectric sensors to shift. When a human body stays motionless in an environment, the two pyroelectric sensors driven by the driving mechanism will shift with respect to the human body, such that the two pyroelectric sensors generate different sensing voltages due to the infrared radiation emitted by the human body. Accordingly, the motionless human body will be detected.

3 Claims, 13 Drawing Sheets

FIG. 13 ent invention relates to a pyroelectric sensing
PYROELECTRIC SENSING DEVICE

BACKGROUND OF THE INVENTION

1. Field of the Invention

The present invention relates to a pyroelectric sensing device, and more particularly, to a pyroelectric sensing device for driving pyroelectric sensors to shift.

2. Description of the Prior Art

Figure 1:
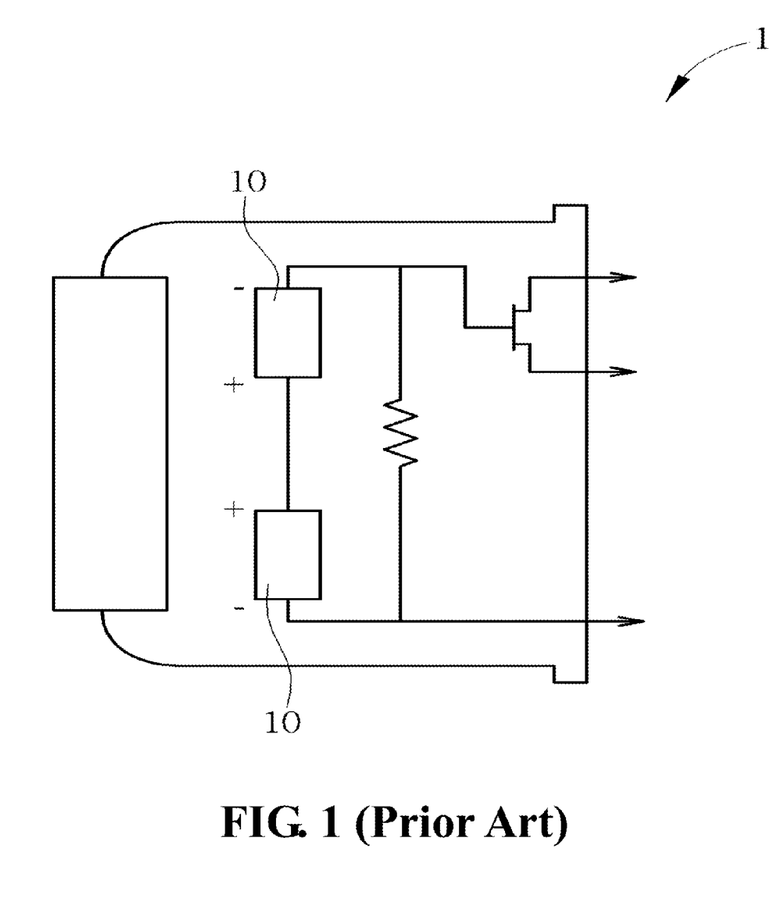
FIG. 1 is an illustrative diagram of a pyroelectric sensing device according to prior art.

Please refer to FIG. 1. FIG. 1 is an illustrative diagram of a pyroelectric sensing device according to prior art. The pyroelectric sensing device 1 is an infrared sensing device which detects whether any human exists in the environment through detecting the infrared radiation emitted by the human body. As shown in FIG. 1, the pyroelectric sensing device 1 comprises two pyroelectric sensors 10, and the two pyroelectric sensors 10 are connected in series wherein the positive electrode of one pyroelectric sensor 10 is connected to the negative electrode of the other pyroelectric sensor 10. The two pyroelectric sensors 10 detect the infrared radiation emitted due to the environment temperature, and convert the detected infrared radiation into a voltage data. When the environment temperature varies, the voltage data converted by the two pyroelectric sensors 10 are offset so that an output voltage is zero. When a human enters the environment where the pyroelectric sensing device 1 is disposed, since the two pyroelectric sensors 10 do not generate the same output voltage, the pyroelectric sensing device 1 is temporarily in a unbalanced status or state, and thus generates a non-zero output voltage.

Because the pyroelectric sensing device 1 is cheap and simple in circuit design, the pyroelectric sensing device 1 is broadly used when human body detecting is required, such as in the application of burglarproof/anti-theft systems, automatic light switching control detection and so on. The disadvantage of the conventional pyroelectric sensing device 1, however, is that the output voltage is generated only when the infrared radiation sensed by the two pyroelectric sensors 10 are different. Generally speaking, the pyroelectric sensing device 1 is motionlessly disposed in the environment, and is only able to detect a moving human body. When the human body is motionless, the pyroelectric sensing device 1 is not able to detect the (motionless) human body, and thus the application of the pyroelectric sensing device 1 is limited.

SUMMARY OF THE INVENTION

One of the purposes of this invention is to provide a pyroelectric sensing device for driving pyroelectric sensors to shift so as to resolve aforementioned problems.

According to one embodiment, the pyroelectric sensing device of this invention comprises two pyroelectric sensors and a driving mechanism. The driving mechanism is used to drive the two pyroelectric sensors to shift.

Preferably, according to another embodiment, the pyroelectric sensing device further comprises a movable base. The two pyroelectric sensors are disposed on the movable base. The driving mechanism is connected to the movable base, and drives the movable base to shift so as to shift the two pyroelectric sensors.

Preferably, according to another embodiment, the driving mechanism comprises a rod, a thermal deformation member and a heater. A first end of the thermal deformation member is fixed and a second end of the thermal deformation member is movable. The first end is opposite to the second end. Two ends of the rod are connected to the movable base and the second end of the thermal deformation member, respectively. The heater is disposed near the first end of the thermal deformation member. When the heater heats the first end of the thermal deformation member, the second end of the thermal deformation member deforms so that the rod enables the movable base to move toward a first direction. When the heater stops heating the first end of the thermal deformation member, the second end of the thermal deformation member recovers back to the original status so that the rod enables the movable base to move toward a second direction. The first direction is opposite to the second direction.

Preferably, according to another embodiment, the driving mechanism comprises a rod, a rotatable member and a motor. The rotatable member is disposed on the motor. Two ends of the rod are connected to the movable base and the rotatable member, respectively. When the motor drives the rotatable member to rotate toward a first direction, the rod enables the movable base to move toward the first direction. When the motor drives the rotatable member to rotate toward a second direction, the rod enables the movable base to move toward the second direction. The first direction is opposite to the second direction.

Preferably, according to another embodiment, the driving mechanism comprises a magnetic member, a movable member, a fixation member, an elastic member and an electromagnet. The magnetic member is fixed on the movable member and connected to the movable base. Two ends of the elastic member are connected to the movable member and the fixation member, respectively. The electromagnet is disposed near the magnetic member. When an electric power is supplied to the electromagnet so that a magnetic suction force is generated between the magnetic member and the electromagnet, the magnetic member enables the movable base and the movable member to move toward a first direction and the movable member compresses the elastic member. When the electric power supplied to the electromagnet is cut off, the elastic member generates an elastic restoring force to push the movable member so that the magnetic member enables the movable base to move toward a second direction. The first direction is opposite to the second direction.

Preferably, according to another embodiment, the driving mechanism comprises a core, a magnetic member, a cone member and a coil. The magnetic member is fixed on the core. The core has a protrusion part. A first end of the cone member is movably disposed on the protrusion part. The coil is fixed on the first end. A second end of the cone member is connected to the movable base. The first end is opposite to the second end. When an electric power is supplied to the coil so that a magnetic force is generated between the magnetic member and the coil, the coil enables the cone member and the movable base to move toward a first direction. When the electric power supplied to the coil is cut off, the cone member enables the movable base to move toward a second direction. The first direction is opposite to the second direction.

Preferably, according to another embodiment, the driving mechanism is a piezoelectric plate. The two pyroelectric sensors are disposed on the piezoelectric plate. The piezoelectric plate deforms so that the two pyroelectric sensors shift when a voltage is applied to the piezoelectric plate.

Preferably, according to another embodiment, the driving mechanism comprises a fixation base and a rotatable member. The rotatable member is pivotally connected to the fixation base. The two pyroelectric sensors are disposed on the rotatable member. The rotatable member rotates so that the two pyroelectric sensors shift when a voltage is applied to the rotatable member.

In conclusion, in the present invention, the driving mechanism is used to drive the two pyroelectric sensors to shift. In practical application, according to the present invention, the driving mechanism may be controlled to periodically drive the two pyroelectric sensors to shift so that the two pyroelectric sensors keep shifting relative to the human body anyway even when the human is motionless, and the output voltage is therefore generated due to the unbalanced infrared radiation detected by the two pyroelectric sensors. No matter as to whether the human body is moving or kept motionless in the environment, the pyroelectric sensing device according to the present invention can detect whether the human exists in the environment, and can further determine whether the human body is moving or being kept motionless.

These and other objectives of the present invention will no doubt become obvious to those of ordinary skill in the art after reading the following detailed description of the preferred embodiment that is illustrated in the various figures and drawings.

DETAILED DESCRIPTION OF PREFERRED EMBODIMENTS

Figure 2:
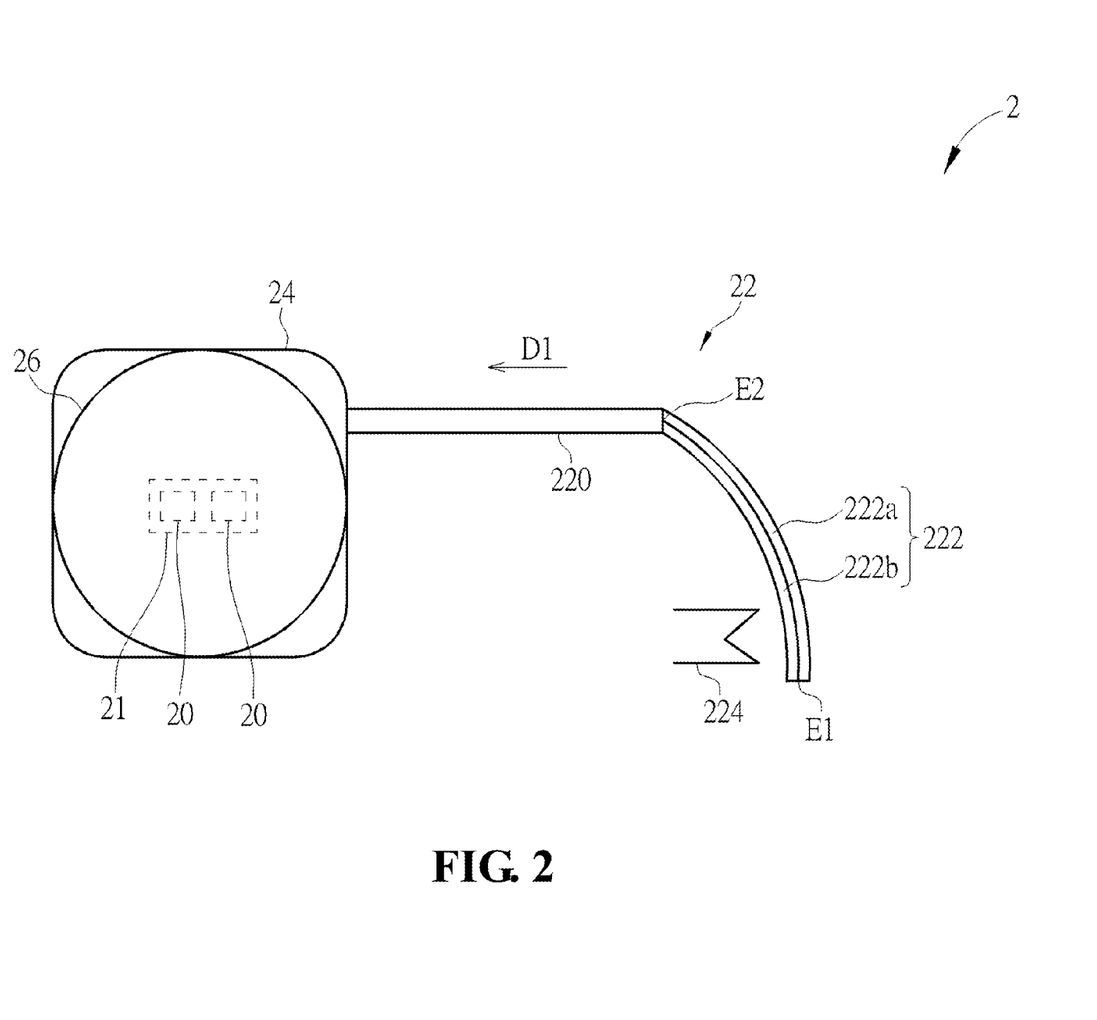
FIG. 2 is an illustrative diagram of a pyroelectric sensing device according to an embodiment of the present invention wherein a movable base moves toward a first direction.
Figure 3:
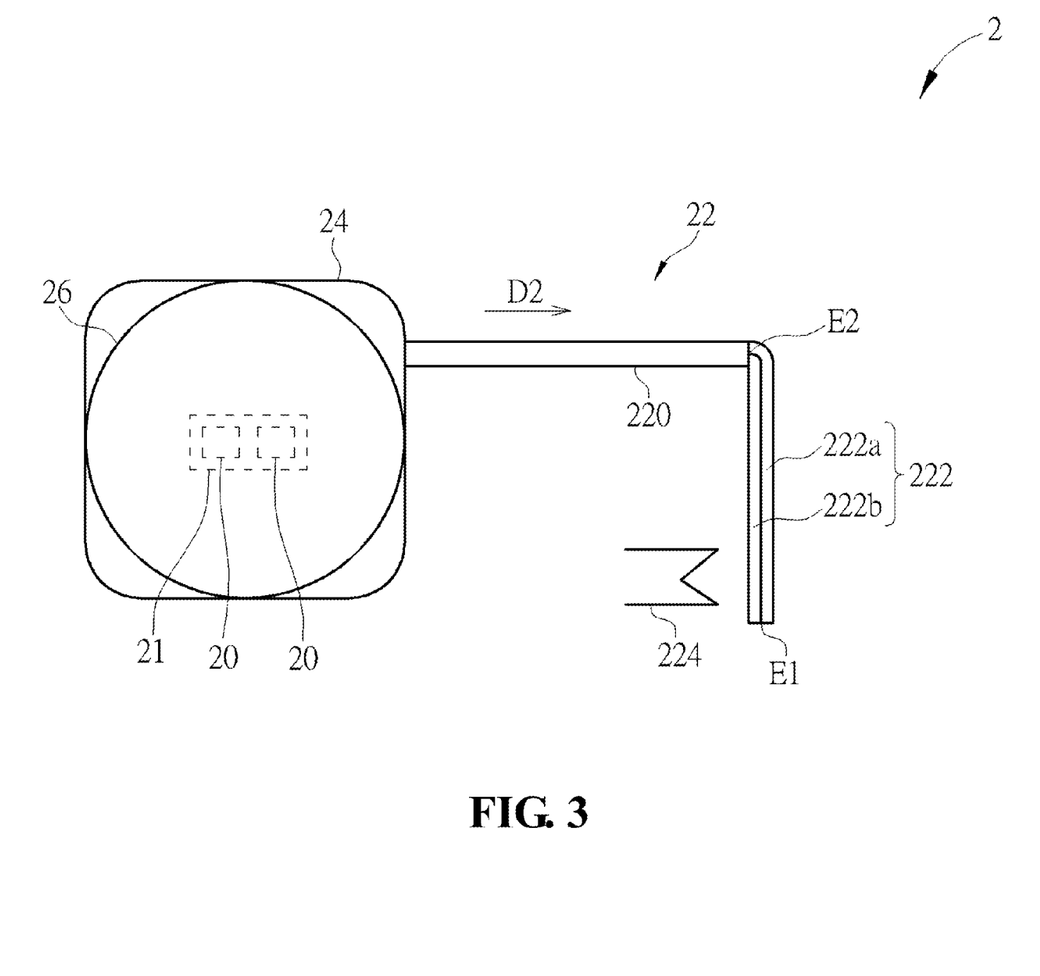
FIG. 3 is an illustrative diagram of the pyroelectric sensing device shown in FIG. 2 wherein the movable base moves toward a second direction.

Please refer to FIG. 2 and FIG. 3. FIG. 2 is an illustrative diagram of a pyroelectric sensing device 2 according to an embodiment of the present invention wherein a movable base 24 moves toward a first direction D1. FIG. 3 is an illustrative diagram of the pyroelectric sensing device 2 shown in FIG. 2 wherein the movable base 24 moves toward a second direction D2. As shown in FIG. 2 and FIG. 3, the pyroelectric sensing device 2 comprises two pyroelectric sensors 20, a driving mechanism 22, a movable base 24 and a condensing lens 26. In practical application, the two pyroelectric sensors 20 can be integrated in a chip 21, and the two pyroelectric sensors 20 are connected in series wherein the positive electrode of one pyroelectric sensor 20 is connected to the negative electrode of the other pyroelectric sensor 20. Please note that the operation of the two pyroelectric sensors 20 is well known by the persons having ordinary skill in the art, and therefore is not described in details herein.

The driving mechanism 22 is used to drive the two pyroelectric sensors 20 to shift in terms of placement location thereof. In the present embodiment, the two pyroelectric sensors 20 are disposed on the movable base 24. The driving mechanism 22 is connected to the movable base 24. The driving mechanism 22 drives the movable base 24 to shift so as to shift the two pyroelectric sensors 20 to a different displacement location. Besides, the condensing lens 26 is disposed on the movable base 24 and covers the two pyroelectric sensors 20. The condensing lens 26 is used to increase the sensing range of the two pyroelectric sensors 20.

In the present embodiment, the driving mechanism 22 comprises a rod 220, a thermal deformation member 222 and a heater 224. The first end E1 of the thermal deformation member 222 is fixed or stationary, and the second end E2 of the thermal deformation member 222 is movable. The first end E1 is opposite to the second end E2. Two ends of the rod 220 are connected to the movable base 24 and the second end E2 of the thermal deformation member 222, respectively. The heater 224 is disposed near the first end E1 of the thermal deformation member 222. When the heater 224 heats the first end E1 of the thermal deformation member 222, the second end E2 of the thermal deformation member 222 deforms so that the rod 220 enables the movable base 24 to move toward the first direction D1 as shown in FIG. 2. When the heater 224 stops heating the first end E1 of the thermal deformation member 222, the second end E2 of the thermal deformation member 222 recovers back to the original status or state so that the rod 220 enables the movable base 24 to move toward the second direction D2 shown in FIG. 3. The first direction D1 is opposite to the second direction D2. By repeating this operation, in the present embodiment of the invention, the heater 224 is controlled to periodically heat the first end E1 of the thermal deformation member 222 so that the two pyroelectric sensors 20 disposed on the movable base 24 shift periodically. When the human body keeps or remains motionless in the environment, the two pyroelectric sensors 20 driven by the driving mechanism 22 still shift (in terms of placement locations thereof) relative to the human body, and the infrared radiation emitted by the human body and sensed by the two pyroelectric sensors 20 is unbalanced so that the pyroelectric sensing device 2 generates the output voltage and the motionless human body is detected.

In the present embodiment, the thermal deformation member 222 is made of an alloy of two different metal layers 222a, 222b. Via different thermal expansion rates for different metal materials, the bending angle, measured in degrees, of the thermal deformation member 222 changes as the temperature of the thermal deformation member 222 changes. The rod 220 therefore enables the movable base 24 to move back and forth toward the first direction D1 and the second direction D2 by repeatedly heating and cooling down the thermal deformation member 222. Please note that it also works to have the thermal deformation member 222 be made of more than two different metal layers, and thus the thermal deformation member 222 is not limited to be made of exactly two different metal layers.

Figure 4:
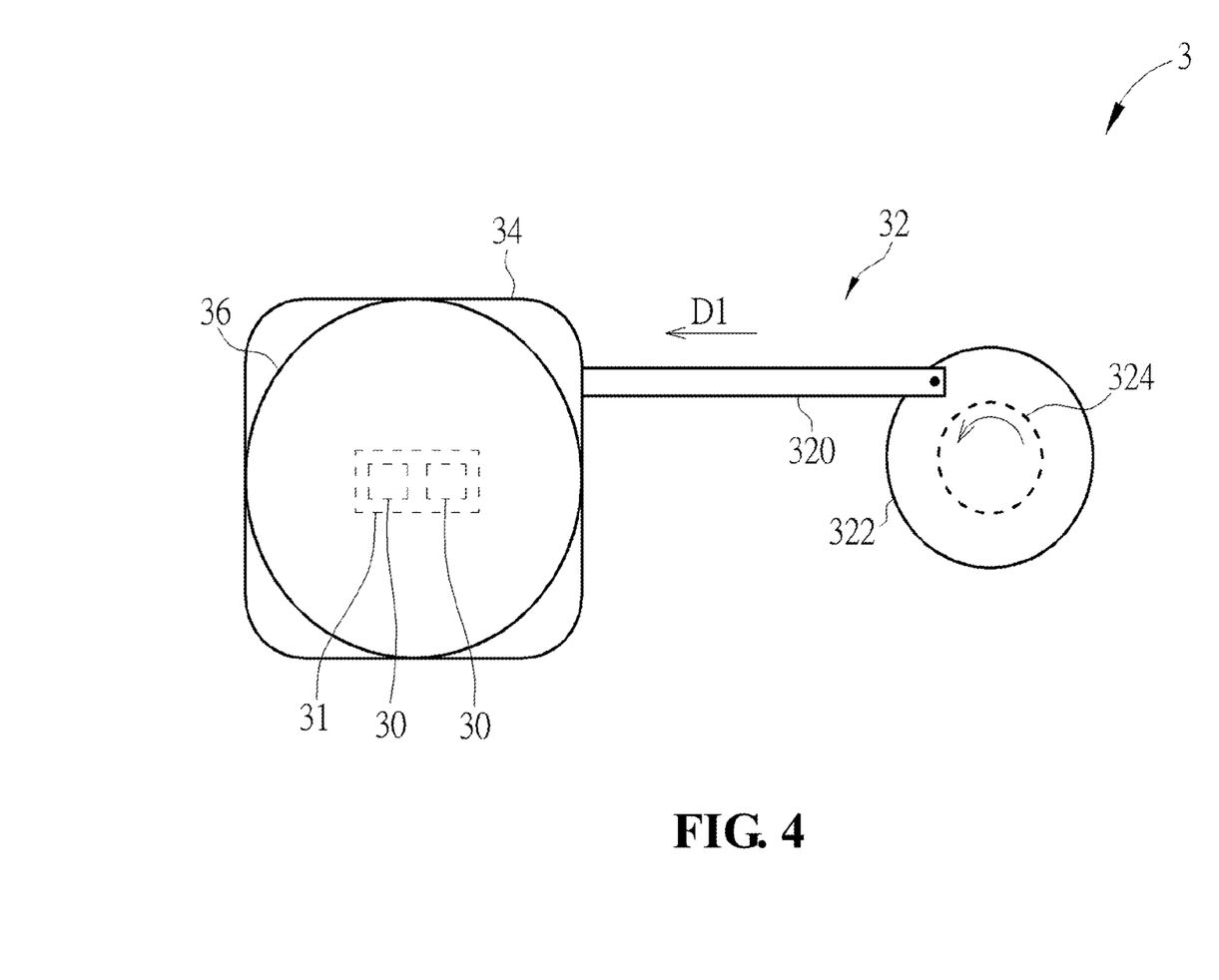
FIG. 4 is an illustrative diagram of a pyroelectric sensing device according to another embodiment of the present invention wherein the movable base moves toward the first direction.
Figure 5:
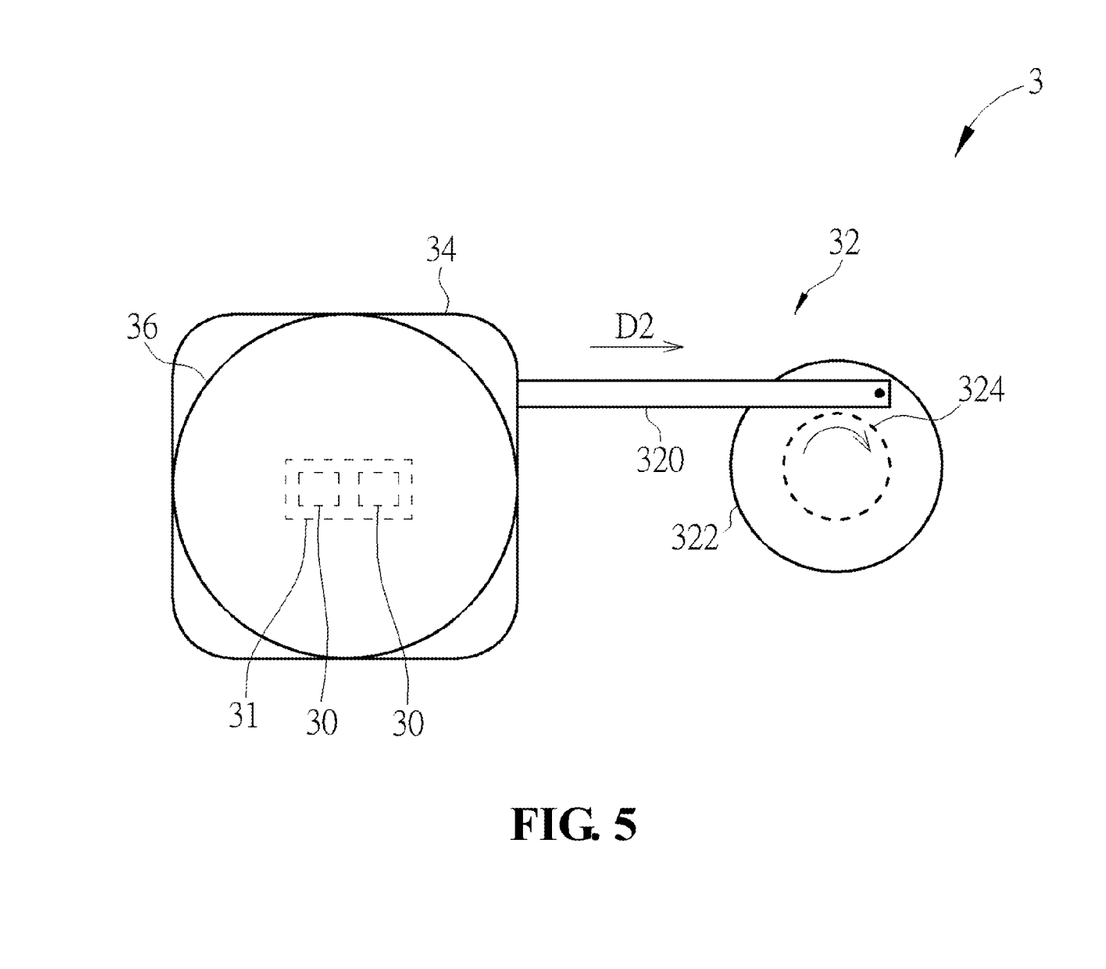
FIG. 5 is an illustrative diagram of the pyroelectric sensing device shown in FIG. 4 wherein the movable base moves toward the second direction.

Please refer to FIG. 4 and FIG. 5. FIG. 4 is an illustrative diagram of a pyroelectric sensing device 3 according to another embodiment of the present invention wherein the movable base 34 moves toward the first direction D1. FIG. 5 is an illustrative diagram of the pyroelectric sensing device 3 shown in FIG. 4 wherein the movable base 34 moves toward the second direction D2. As shown in FIG. 4 and FIG. 5, the pyroelectric sensing device 3 comprises two pyroelectric sensors 30, a driving mechanism 32, a movable base 34 and a condensing lens 36. In practical application, the two pyroelectric sensors 30 can be integrated in a chip 31, and the two pyroelectric sensors 30 are connected in series wherein the positive electrode of one pyroelectric sensor 30 is connected to the negative electrode of the other pyroelectric sensor 30. Please note that the operation of the two pyroelectric sensors 30 is well known by the persons having ordinary skill in the art, and therefore is not described in details herein.

The driving mechanism 32 is used to drive the two pyroelectric sensors 30 to shift in terms of placement locations thereof. In the present embodiment, the two pyroelectric sensors 30 are disposed on the movable base 34. The driving mechanism 32 is connected to the movable base 34. The driving mechanism 32 drives the movable base 34 to shift so as to shift the two pyroelectric sensors 30. Besides, the condensing lens 36 is disposed on the movable base 34 and covers the two pyroelectric sensors 30. The condensing lens 36 is used to increase the sensing range of the two pyroelectric sensors 30.

In the present embodiment, the driving mechanism 32 comprises a rod 320, a rotatable member 322 and a motor 324. The rotatable member 322 is disposed on the motor 324. Two ends of the rod 320 are connected to the movable base 34 and the rotatable member 322, respectively. When the motor 324 drives the rotatable member 322 to rotate toward the first direction D1, the rod 320 enables the movable base 34 to move toward the first direction D1 as shown in FIG. 4. When the motor 324 drives the rotatable member 322 to rotate toward the second direction D2, the rod 320 enables the movable base 34 to move toward the second direction D2 as shown in FIG. 5. The first direction D1 is opposite to the second direction D2. By repeating this operation, in the present embodiment of the invention, the motor 324 is controlled to periodically drive the rotatable member 322 to rotate back and forth toward the first direction D1 and the second direction D2 so that the two pyroelectric sensors 30 disposed on the movable base 34 keeps shifting periodically. When the human body keeps or remains motionless in the environment, the two pyroelectric sensors 30 driven by the driving mechanism 32 still shift relative to the human body, and the infrared radiation emitted by the human body and sensed by the two pyroelectric sensors 30 is unbalanced so that the pyroelectric sensing device 3 generates the output voltage and the motionless human body is detected.

Figure 6:
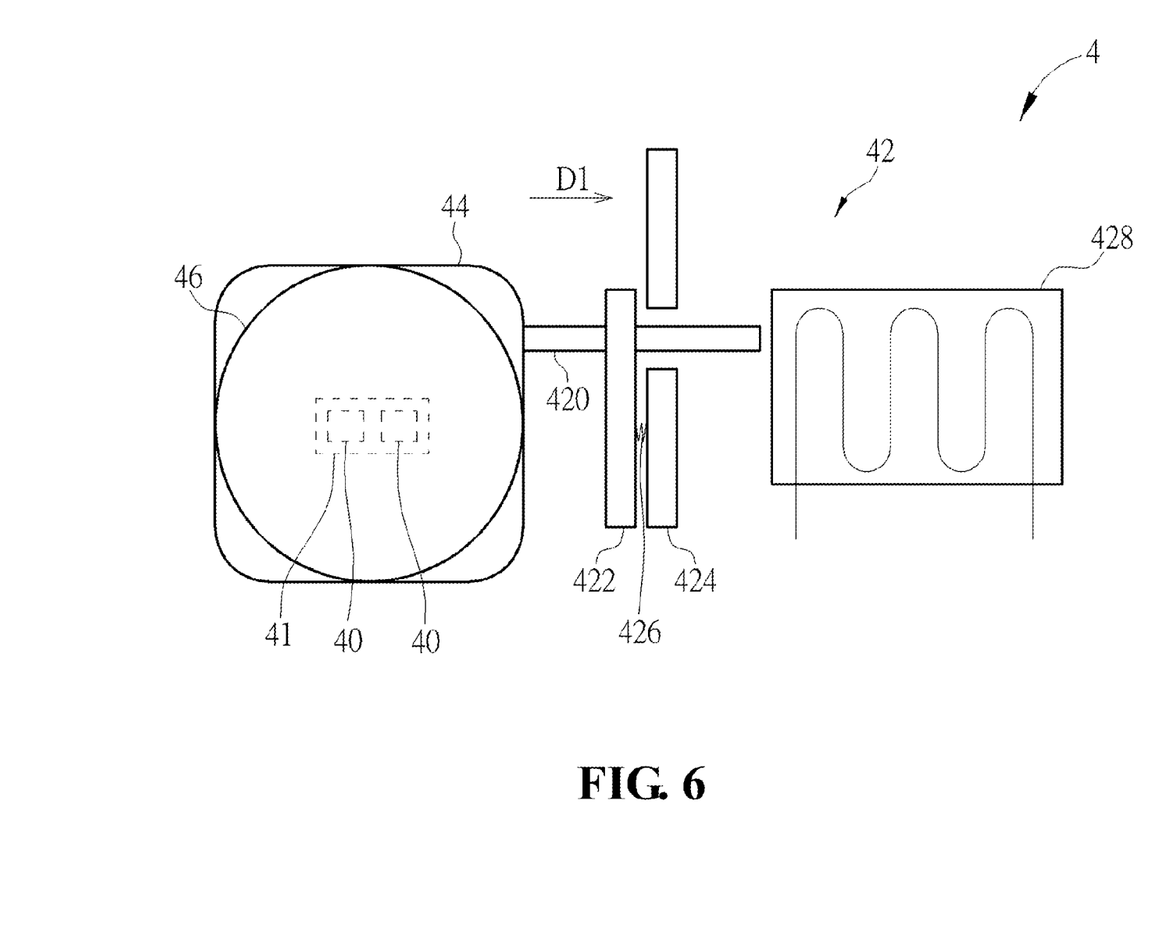
FIG. 6 is an illustrative diagram of a pyroelectric sensing device according to another embodiment of the present invention wherein the movable base moves toward the first direction.
Figure 7:
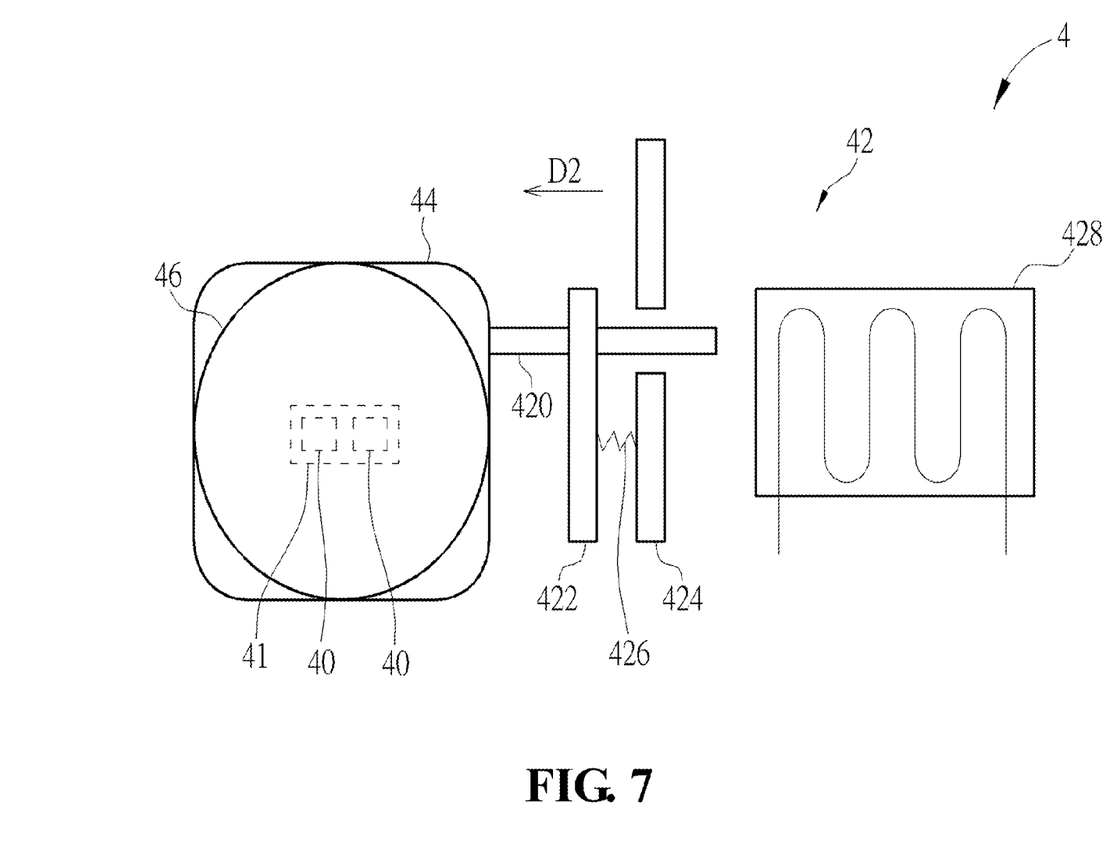
FIG. 7 is an illustrative diagram of the pyroelectric sensing device shown in FIG. 6 wherein the movable base moves toward the second direction.

Please refer to FIG. 6 and FIG. 7. FIG. 6 is an illustrative diagram of a pyroelectric sensing device 4 according to another embodiment of the present invention wherein the movable base 44 moves toward the first direction D1. FIG. 7 is an illustrative diagram of the pyroelectric sensing device 4 shown in FIG. 6 wherein the movable base 44 moves toward the second direction D2. As shown in FIG. 6 and FIG. 7, the pyroelectric sensing device 4 comprises two pyroelectric sensors 40, a driving mechanism 42, a movable base 44 and a condensing lens 46. In practical application, the two pyroelectric sensors 40 can be integrated in a chip 41, and the two pyroelectric sensors 40 are connected in series wherein the positive electrode of one pyroelectric sensor 40 is connected to the negative electrode of the other pyroelectric sensor 40. Please note that the operation of the two pyroelectric sensors 40 is well known by the persons having ordinary skill in the art, and therefore is not described in details herein.

The driving mechanism 42 is used to drive the two pyroelectric sensors 40 to shift in terms of placement locations thereof. In the present embodiment, the two pyroelectric sensors 40 are disposed on the movable base 44. The driving mechanism 42 is connected to the movable base 44. The driving mechanism 42 drives the movable base 44 to shift so as to shift the two pyroelectric sensors 40. Besides, the condensing lens 46 is disposed on the movable base 44 and covers the two pyroelectric sensors 40. The condensing lens 46 is used to increase the sensing range of the two pyroelectric sensors 40.

In the present embodiment, the driving mechanism 42 comprises a magnetic member 420, a movable member 422, a fixation member 424, an elastic member 426 and an electromagnet 428. The magnetic member 420 is fixed on the movable member 422 and connected to the movable base 44. The magnetic member 420 can be, for example, a magnetic, a metal bar or other permeability material. Two ends of the elastic member 426 are connected to the movable member 422 and the fixation member 424, respectively. The elastic member 426 can be, for example, a spring or other elastomer. The electromagnet 428 is disposed near the magnetic member 420. When an electric power is supplied to the electromagnet 428 so that a magnetic suction force is generated between the magnetic member 420 and the electromagnet 428, the magnetic member 420 enables the movable base 44 and the movable member 422 to move toward the first direction D1 and the movable member 422 compresses the elastic member 426 as shown in FIG. 6. When the electric power supplied to the electromagnet 428 is cut off, the magnetic suction force between the magnetic member 420 and the electromagnet 428 disappears and the elastic member 426 generates an elastic restoring force to push the movable member 422 so that the magnetic member 420 enables the movable base 44 to move toward the second direction D2 as shown in FIG. 7. The first direction D1 is opposite to the second direction D2. By repeating this operation, in the present embodiment of the invention, the electric power is supplied to the electromagnet 428 and then cut off periodically so that the two pyroelectric sensors 40 disposed on the movable base 44 keeps shifting periodically. When the human body keeps motionless in the environment, the two pyroelectric sensors 40 driven by the driving mechanism 42 still shift relative to the human body, and the infrared radiation emitted by the human body and sensed by the two pyroelectric sensors 40 is unbalanced so that the pyroelectric sensing device 4 generates the output voltage and the motionless human body is detected.

Figure 8:
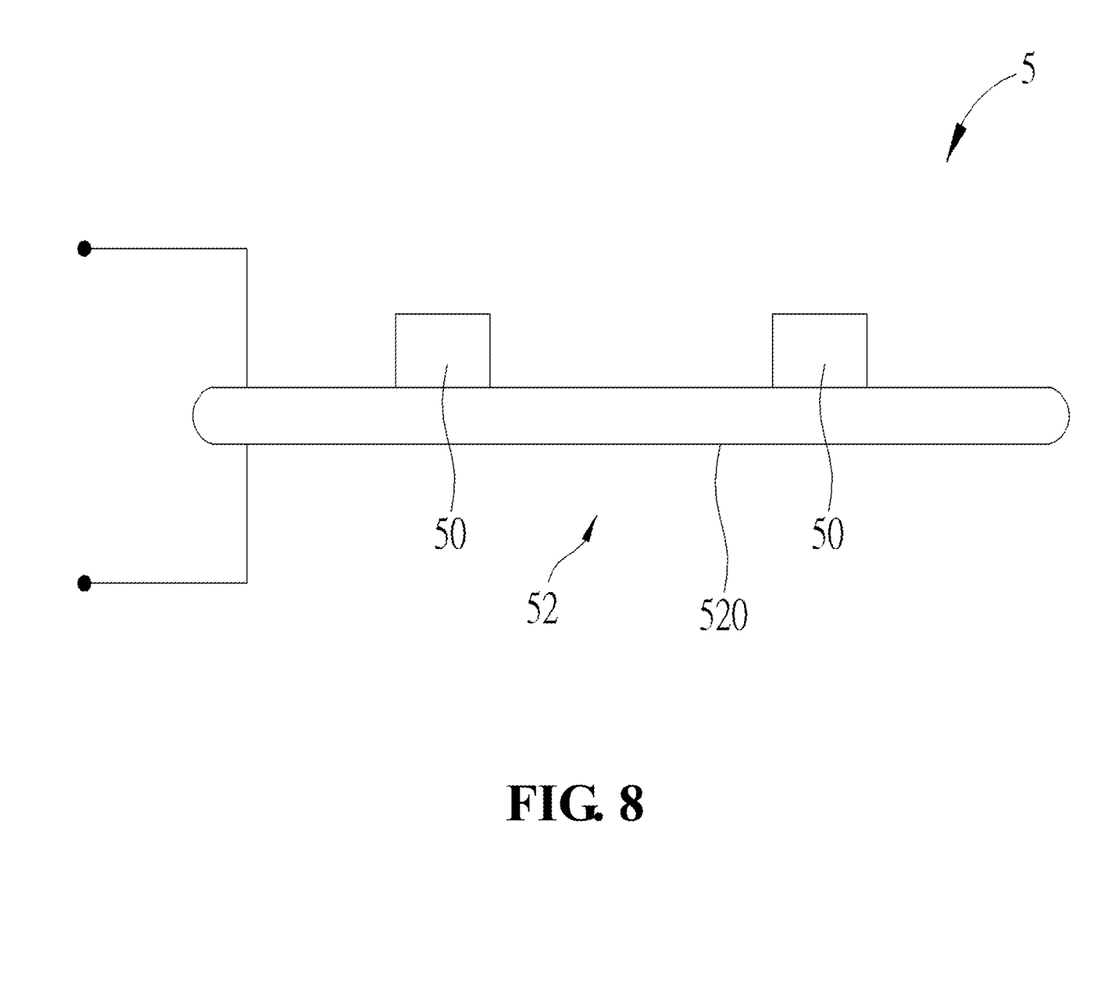
FIG. 8 is an illustrative diagram of a pyroelectric sensing device according to another embodiment of the present invention wherein the piezoelectric plate is not applied with a voltage and maintains flat.
Figure 9:
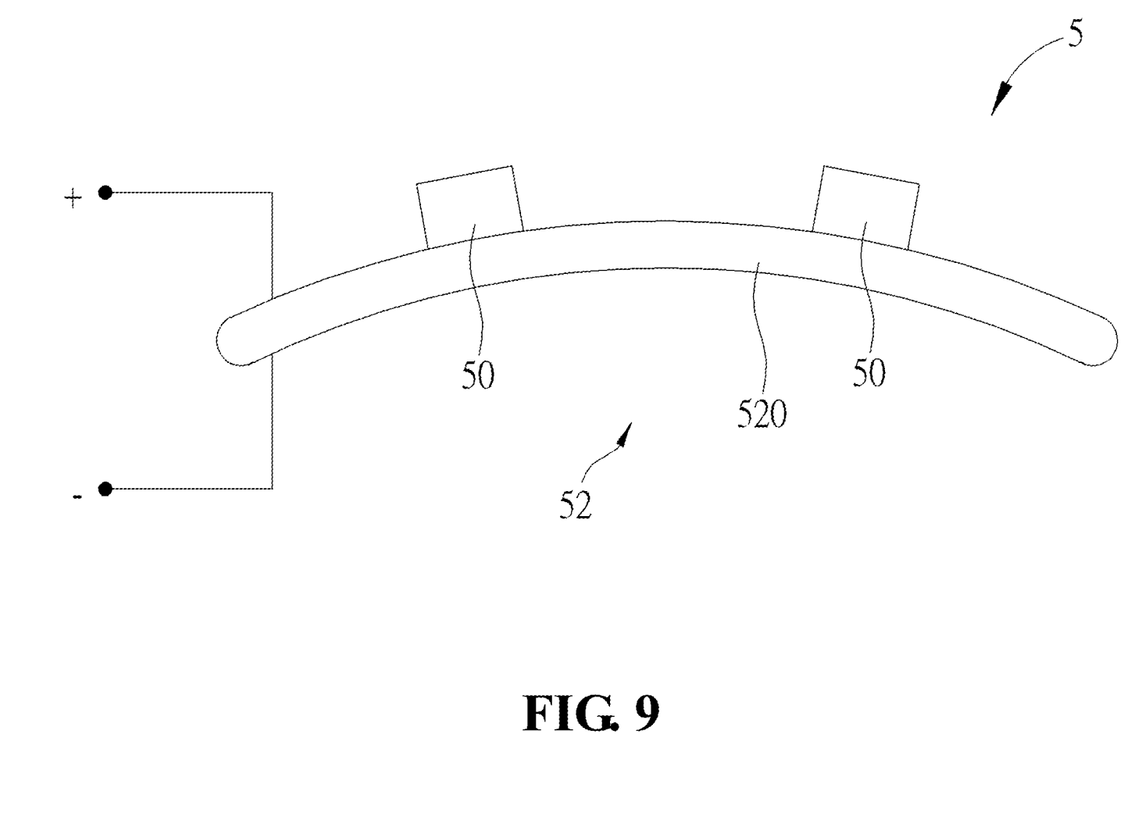
FIG. 9 is an illustrative diagram of the pyroelectric sensing device shown in FIG. 8 wherein the piezoelectric plate is applied with a voltage and appears prominent upwards.
Figure 10:
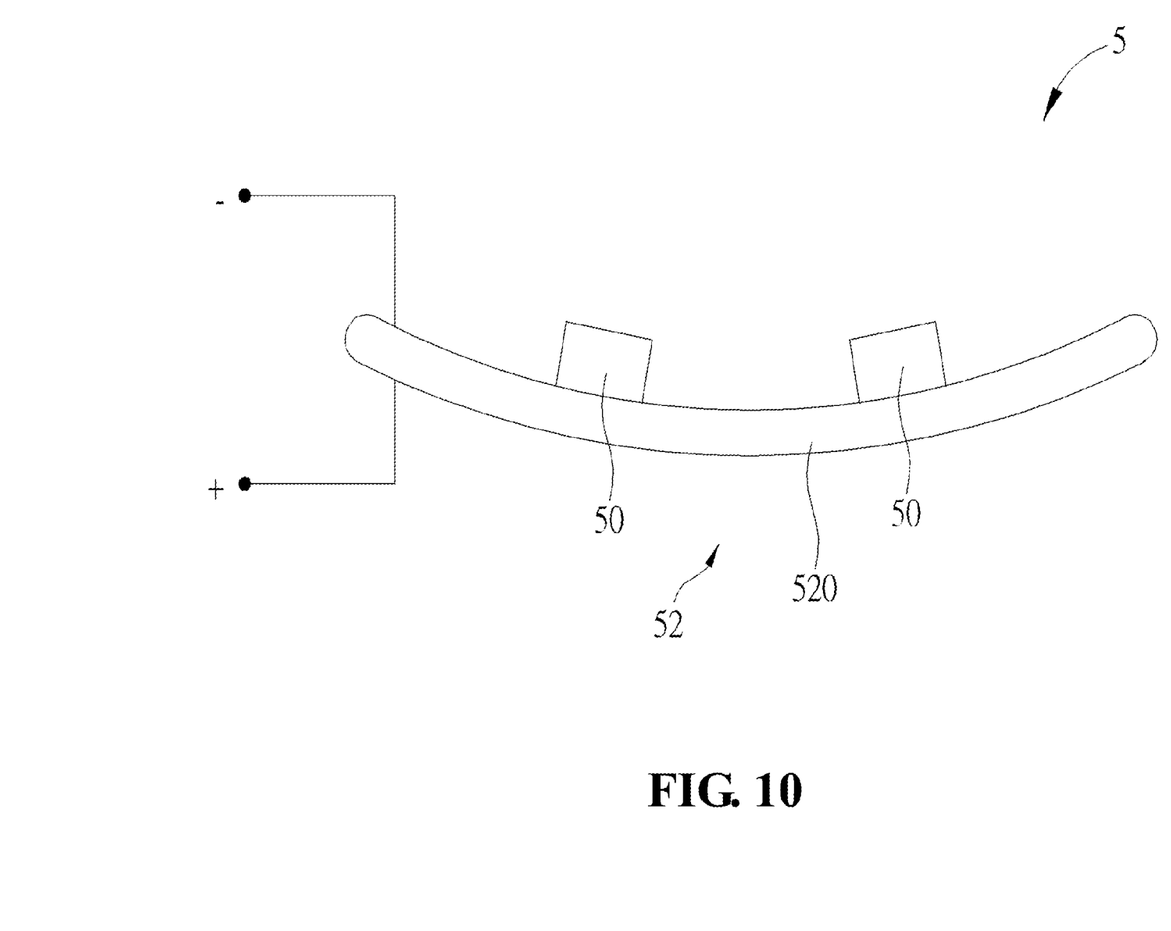
FIG. 10 is an illustrative diagram of the pyroelectric sensing device shown in FIG. 8 wherein the piezoelectric plate is applied with another voltage and appears prominent downwards.

Please refer to FIG. 8 to FIG. 10. FIG. 8 is an illustrative diagram of a pyroelectric sensing device 5 according to another embodiment of the present invention wherein a piezoelectric plate 520 is not applied with a voltage and maintains to be flat. FIG. 9 is an illustrative diagram of the pyroelectric sensing device 5 shown in FIG. 8 wherein the piezoelectric plate 520 is applied with a voltage and appears to be bent or curved upwards. FIG. 10 is an illustrative diagram of the pyroelectric sensing device 5 shown in FIG. 8 wherein the piezoelectric plate 520 is applied with another voltage and appears to be bent or curved downwards. As shown in FIG. 8 to FIG. 10, the pyroelectric sensing device 5 comprises two pyroelectric sensors 50 and a driving mechanism 52. In the present embodiment, the driving mechanism 52 is a piezoelectric plate 520 and the two pyroelectric sensors 50 are disposed on the piezoelectric plate 520. In practical application, the two pyroelectric sensors 50 can be integrated in a chip, and the two pyroelectric sensors 50 are connected in series wherein the positive electrode of one pyroelectric sensor 50 is connected to the negative electrode of the other pyroelectric sensor 50. Please note that the operation of the two pyroelectric sensors 50 is well known by the persons having ordinary skill in the art, and therefore is not described in details herein.

As shown in FIG. 8, when the piezoelectric plate 520 is not applied with a voltage, the piezoelectric plate 520 maintains to be flat. As shown in FIG. 9, when the piezoelectric plate 520 is applied with a voltage, the piezoelectric plate 520 deforms and appears bent upwards so that the two pyroelectric sensors 50 shift upwards. As shown in FIG. 10, when the piezoelectric plate 520 is applied with another voltage with different polarization, the piezoelectric plate 520 deforms and appears bent downwards so that the two pyroelectric sensors 50 shift downwards. By repeating this operation, in the present embodiment of the invention, the piezoelectric plate 520 is applied with a voltage and the polarization of the voltage periodically changes so that the two pyroelectric sensors 50 disposed on the piezoelectric plate 520 shift periodically. When the human body keeps motionless in the environment, the two pyroelectric sensors 50 driven by the driving mechanism 52 still shift relative to the human body, and the infrared radiation emitted by the human body and sensed by the two pyroelectric sensors 50 is unbalanced so that the pyroelectric sensing device 5 generates the output voltage and the motionless human body is detected.

Figure 11:
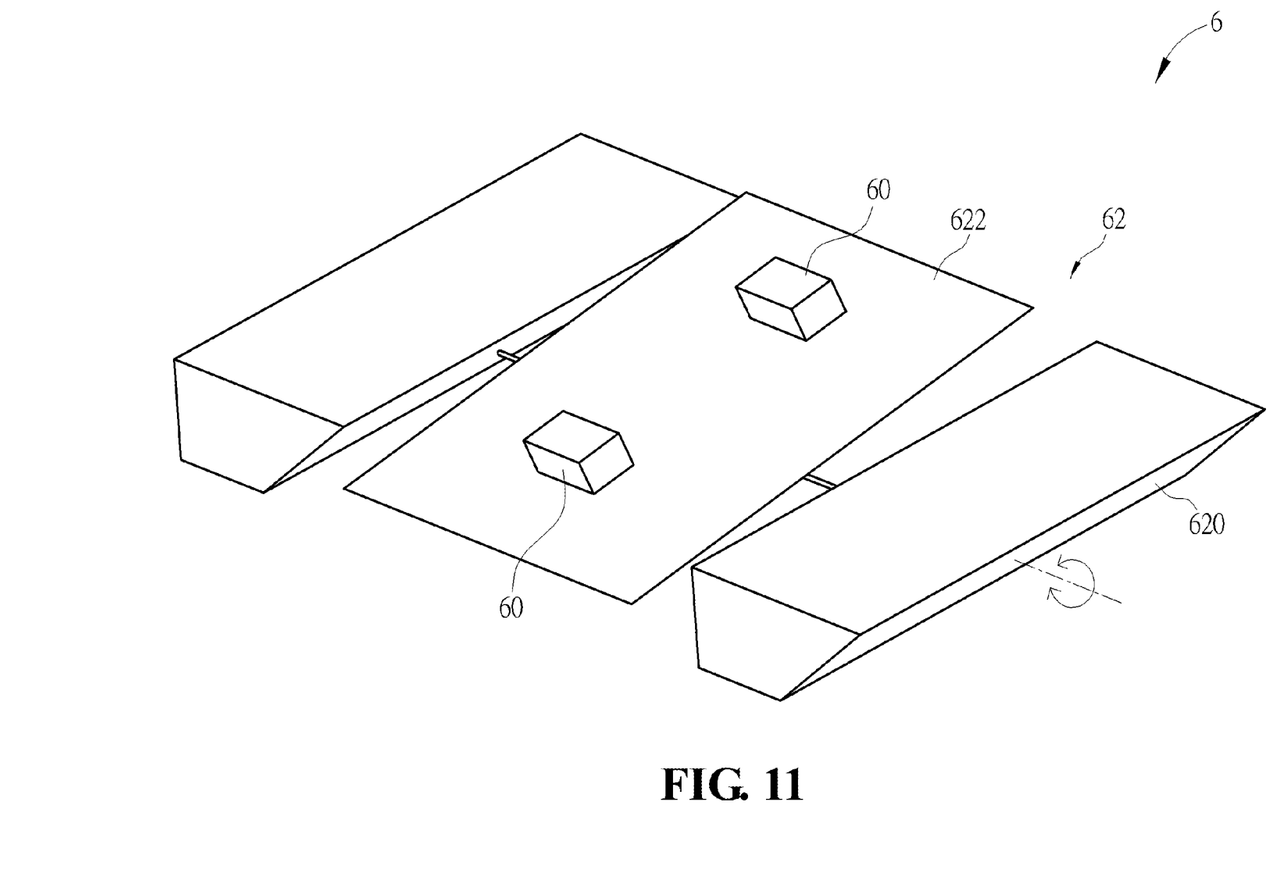
FIG. 11 is an illustrative diagram of a pyroelectric sensing device according to another embodiment of the present invention.

Please refer to FIG. 11. FIG. 11 is an illustrative diagram of a pyroelectric sensing device 6 according to another embodiment of the present invention. As shown in FIG. 11, the pyroelectric sensing device 6 comprises two pyroelectric sensors 60 and a driving mechanism 62. In the present embodiment, the driving mechanism 62 comprises a fixation base 620 and a rotatable member 622. The rotatable member 622 is pivotally-connected to the fixation base 620. The two pyroelectric sensors 60 are disposed on the rotatable member 622. In practical application, the fixation base 620, the rotatable member 622 and the two pyroelectric sensors 60 can be integrated in a chip via a MEMS (Micro-Electro-Mechanical System) manufacturing process, and the two pyroelectric sensors 60 are connected in series wherein the positive electrode of one pyroelectric sensor 60 is connected to the negative electrode of the other pyroelectric sensor 60. Please note that the operation of the two pyroelectric sensors 60 is well known by the persons having ordinary skill in the art, and therefore is not described in details herein.

When a voltage is applied to the rotatable member 622, the rotatable member 622 rotates relative to the fixation base 620 so that the two pyroelectric sensors 60 shift (in locations thereof). By repeating this operation, in the present embodiment of the invention, the voltage is periodically applied to the rotatable member 622 so that the two pyroelectric sensors 60 disposed on the rotatable member 622 shift periodically. When the human body keeps motionless in the environment, the two pyroelectric sensors 60 driven by the driving mechanism 62 still shift relative to the human body, and the infrared radiation emitted by the human body and sensed by the two pyroelectric sensors 60 is unbalanced so that the pyroelectric sensing device 6 generates the output voltage and the motionless human body is detected.

Figure 12:
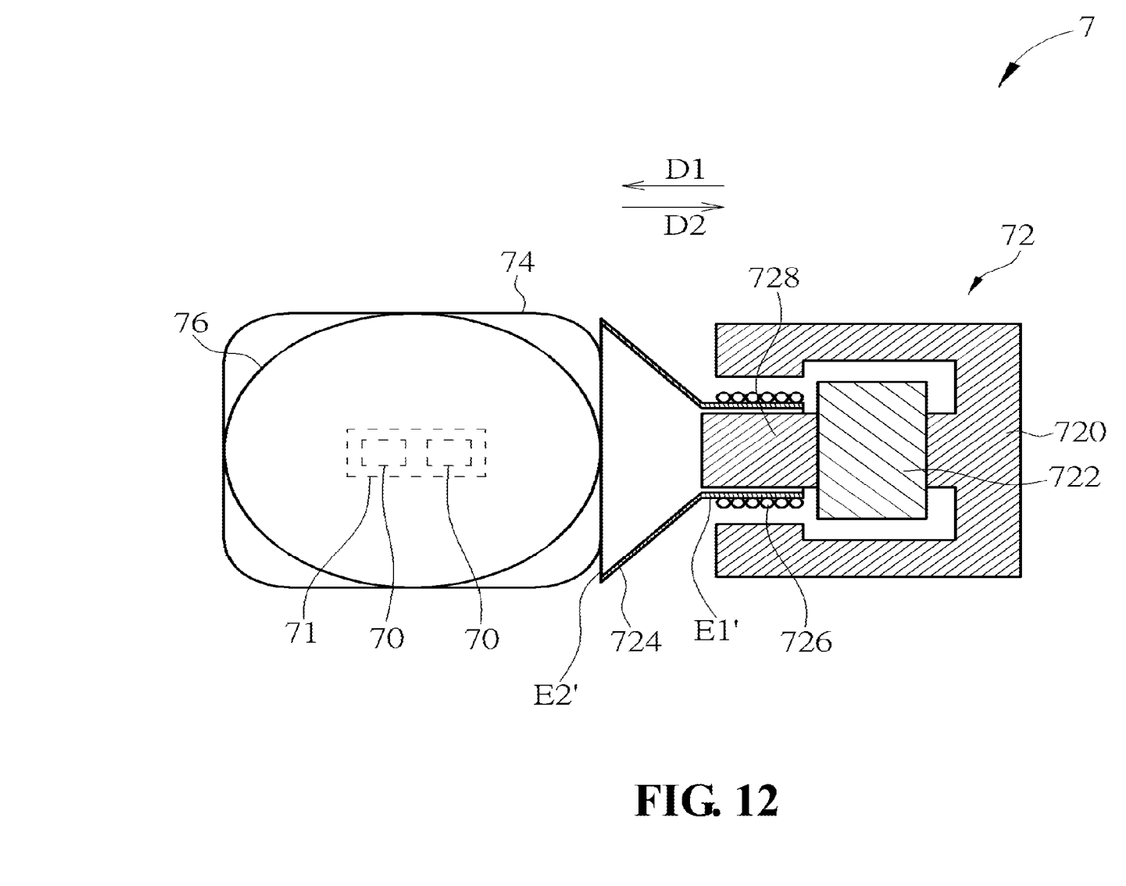
FIG. 12 is an illustrative diagram of a pyroelectric sensing device according to another embodiment of the present invention.

Please refer to FIG. 12. FIG. 12 is an illustrative diagram of a pyroelectric sensing device 7 according to another embodiment of the present invention. As shown in FIG. 12, the pyroelectric sensing device 7 comprises two pyroelectric sensors 70, a driving mechanism 72, a movable base 74 and a condensing lens 76. In practical application, the two pyroelectric sensors 70 can be integrated in a chip 71, and the two pyroelectric sensors 70 are connected in series wherein the positive electrode of one pyroelectric sensor 70 is connected to the negative electrode of the other pyroelectric sensor 70. Please note that the operation of the two pyroelectric sensors 70 is well known by the persons having ordinary skill in the art, and therefore is not described in details herein.

The driving mechanism 72 is used to drive the two pyroelectric sensors 70 to shift. In the present embodiment, the two pyroelectric sensors 70 are disposed on the movable base 74. The driving mechanism 72 is connected to the movable base 74. The driving mechanism 72 drives the movable base 74 to shift so as to shift the two pyroelectric sensors 70. Besides, the condensing lens 76 is disposed on the movable base 74 and covers the two pyroelectric sensors 70. The condensing lens 76 is used to increase the sensing range of the two pyroelectric sensors 70.

In the present embodiment, the driving mechanism 72 comprises a core 720, a magnetic member 722, a cone member 724 and a coil 726. The magnetic member 722 is fixed on the core 720. The core 720 has a protrusion part 728. For example, the core 720 can be an iron core and the magnetic member 722 can be a magnetic or other permeability material. The first end E1' of the cone member 724 is movably disposed on the protrusion part 728. The second end E2' of the cone member 724 is connected to the movable base 74. The first end E1' is opposite to the second end E2'. The coil 726 is fixed on the first end E1' of the cone member 724 and disposed around the protrusion part 728. In the present embodiment, the driving mechanism 72 which are mainly made of the core 720, the magnetic member 722, the cone member 724 and the coil 726 can be implemented by a speaker, and the cone member 724 can be the paper cone structure of the speaker. Please note that the operation and the structure of the speaker are well known by the persons having ordinary skill in the art, and therefore are not described in details herein.

When an electric power is supplied to the coil 726 so that a magnetic force is generated between the magnetic member 722 and the coil 726, the coil 726 enables the cone member 724 and the movable base 74 to move toward the first direction D1. When the electric power supplied to the coil 726 is cut off, the magnetic force between the magnetic member 722 and the coil 726 disappears, and the cone member 724 enables the movable base 74 to move toward the second direction D2. The first direction D1 is opposite to the second direction D2. In the present embodiment, when the electric power is supplied to the coil 726, the magnetic force generated between the magnetic member 722 and the coil 726 is a magnetic push force. In another embodiment, however, when the electric power is supplied to the coil 726, the magnetic force generated between the magnetic member 722 and the coil 726 can be a magnetic suction force. Under the circumstance, the coil 726 enables the cone member 724 and the movable base 74 to move toward the second direction D2. When the electric power supplied to the coil 726 is cut off, the magnetic suction force between the magnetic member 722 and the coil 726 disappears and the cone member 724 enables the movable base 74 to move toward the first direction D1. Please note that when the electric power supplied to the coil 726 is cut off, in the present embodiment of the invention, through the recovery force provided by the cone member 724 or additional elastic member, such as the damper of the speaker, the movable base 74 is driven to move.

By repeating this operation, in the present embodiment of the invention, the electric power is supplied to the coil 726 and then cut off periodically so that the two pyroelectric sensors 70 disposed on the movable base 74 keeps shifting periodically. When the human body keeps motionless in the environment, the two pyroelectric sensors 70 driven by the driving mechanism 72 still shift relative to the human body, and the infrared radiation emitted by the human body and sensed by the two pyroelectric sensors 70 is unbalanced so that the pyroelectric sensing device 7 generates the output voltage and the motionless human body is detected. When the driving mechanism 72 is a speaker, the driving mechanism 72 can be driven by low frequency signals, such as the signals with the frequency lower than 20 Hz that the human ear is not aware of, to avoid undesired noise.

Figure 13:
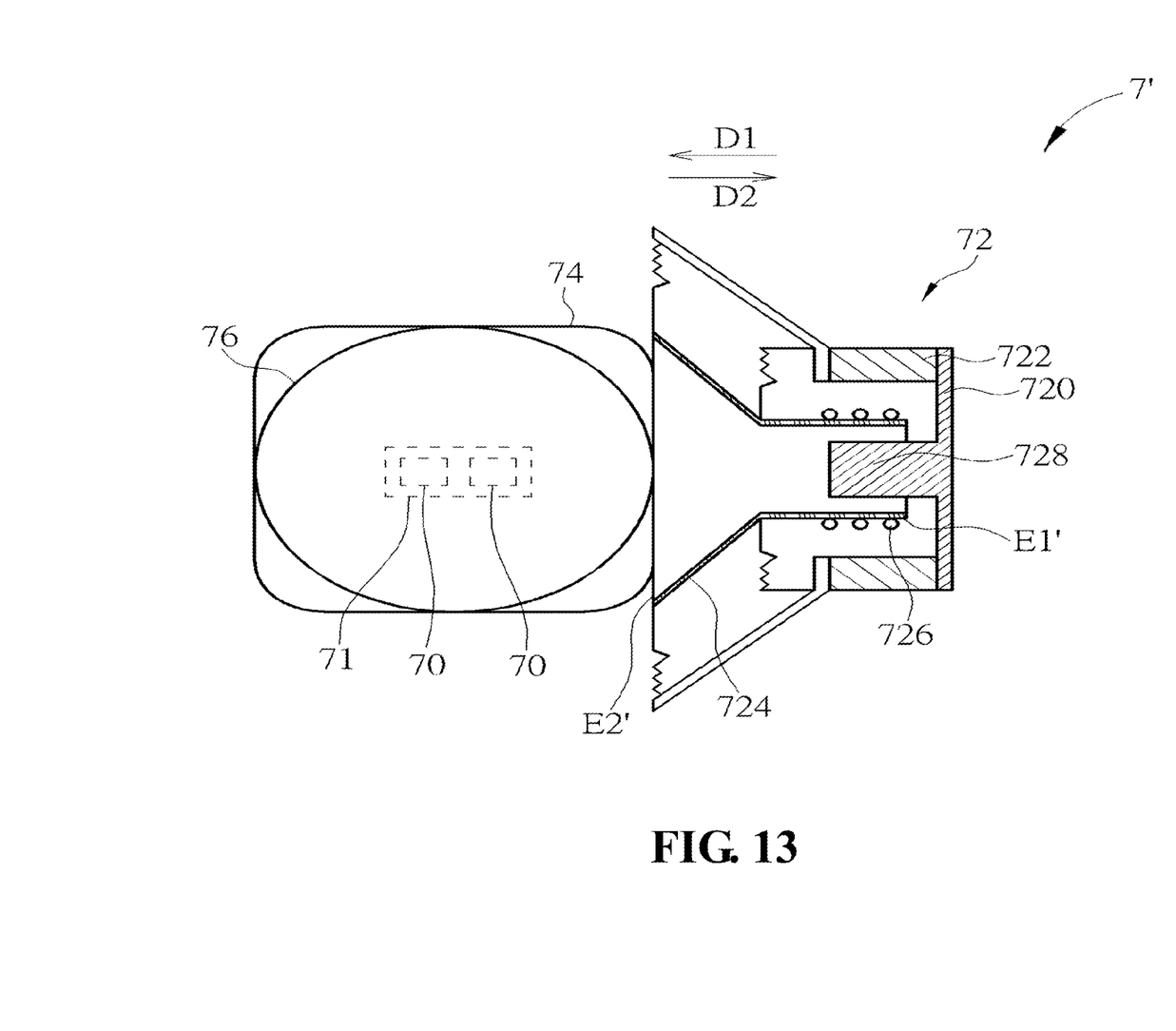
FIG. 13 is an illustrative diagram of a pyroelectric sensing device according to another embodiment of the present invention.

Please refer to FIG. 13. FIG. 13 is an illustrative diagram of a pyroelectric sensing device 7' according to another embodiment of the present invention. The main difference between the pyroelectric sensing device 7' and the pyroelectric sensing device 7 is that the pyroelectric sensing device 7' is the outside magnet field type and the pyroelectric sensing device 7 is the inside magnet field type. As shown in FIG. 12, the core 720 of the pyroelectric sensing device 7 appears the E shape, and the magnetic member 722 is disposed on the protrusion part 728 inside the core 722. As shown in FIG. 13, however, the magnetic member 722 of the pyroelectric sensing device 7' is exposed outside. Please note that the components shown in FIG. 13 with the same labeling numbers as those shown in FIG. 12 operate in substantially the same way and are not repeatedly described in details herein.

In conclusion, in the present invention, the driving mechanism is used to drive the two pyroelectric sensors to shift. In practical application, according to the invention, the driving mechanism may be controlled to periodically drive the two pyroelectric sensors to shift so that the two pyroelectric sensors shift relative to the human body anyway even when the human is motionless, and the output voltage is therefore generated due to the unbalance infrared detected by the two pyroelectric sensors. No matter the human body moves or keeps motionless in the environment, the pyroelectric sensing device according to the invention can detect whether the human exists in the environment, and can further determine whether the human body moves or keeps motionless. In the invention, the two pyroelectric sensors can be driven by, for example, a thermal deformation member, a motor, an electromagnet or a speaker to shift. Alternatively, the two pyroelectric sensors can be driven by, for example, a piezoelectric plate or a MEMS structure to shift. When the two pyroelectric sensors is driven by a piezoelectric plate or a MEMS structure, the two pyroelectric sensors as well as the piezoelectric plate or the MEMS structure can be integrated in a chip in the present invention so that the whole volume of the pyroelectric sensing device can be decreased or minimized.

Those skilled in the art will readily observe that numerous modifications and alterations of the device and method may be made while retaining the teachings of the invention.

What is claimed is:

1. A pyroelectric sensing device comprising:
two pyroelectric sensors;
a driving mechanism for driving the two pyroelectric sensors to shift; and
a movable base, wherein the two pyroelectric sensors are disposed on the movable base, the driving mechanism is connected to the movable base, and the driving mechanism drives the movable base to shift so as to shift the two pyroelectric sensors, and wherein the driving mechanism comprises a core, a magnetic member, a cone member and a coil, the magnetic member is fixed on the core, the core has a protrusion part, a first end of the cone member is movably disposed on the protrusion part, the coil is fixed on the first end, a second end of the cone member is connected to the movable base, the first end is opposite to the second end, when an electric power is supplied to the coil so that a magnetic force is generated between the magnetic member and the coil, the coil enables the cone member and the movable base to move toward a first direction, when the electric power supplied to the coil is cut off, the cone member enables the movable base to move toward a second direction, and the first direction is opposite to the second direction.

2. The pyroelectric sensing device of claim 1, further comprising a condensing lens which is disposed on the movable base and covers the two pyroelectric sensors.

3. The pyroelectric sensing device of claim 1, wherein the two pyroelectric sensors are integrated in a chip.

* * * * *